(12) United States Patent
Ozick

(10) Patent No.: US 6,661,239 B1
(45) Date of Patent: Dec. 9, 2003

(54) CAPACITIVE SENSOR SYSTEMS AND METHODS WITH INCREASED RESOLUTION AND AUTOMATIC CALIBRATION

(75) Inventor: Daniel N. Ozick, Newton, MA (US)

(73) Assignee: iRobot Corporation, Burlington, MA (US)

(*) Notice: Subject to any disclaimer, the term of this patent is extended or adjusted under 35 U.S.C. 154(b) by 52 days.

(21) Appl. No.: 10/038,111

(22) Filed: Jan. 2, 2002

Related U.S. Application Data

(60) Provisional application No. 60/259,360, filed on Jan. 2, 2001, and provisional application No. 60/266,260, filed on Feb. 2, 2001.

(51) Int. Cl.[7] ............................................. G01R 27/26
(52) U.S. Cl. ....................................................... 324/658
(58) Field of Search ................................. 324/658, 663, 324/678, 686, 76.66; 345/173, 163; 73/862.337

(56) References Cited

U.S. PATENT DOCUMENTS

| | | | |
|---|---|---|---|
| 3,569,727 A | * 3/1971 | Aggarwai | .................. 307/106 |
| 5,033,291 A | 7/1991 | Podoloff et al. | |
| 5,505,072 A | 4/1996 | Oreper | |
| 5,756,904 A | 5/1998 | Oreper et al. | |
| 5,777,596 A | * 7/1998 | Herbert | ...................... 345/104 |
| 5,831,597 A | * 11/1998 | West et al. | .................. 345/163 |
| 5,905,209 A | 5/1999 | Oreper | |
| 5,989,700 A | 11/1999 | Krivopal | |
| 6,032,542 A | 3/2000 | Warnick et al. | |
| 6,049,620 A | * 4/2000 | Dickinson et al. | .......... 382/124 |
| 6,272,936 B1 | 8/2001 | Oreper et al. | |
| 2003/0067451 A1 | * 4/2003 | Tagg et al. | .................. 345/174 |

* cited by examiner

*Primary Examiner*—N. Le
*Assistant Examiner*—Amy He
(74) *Attorney, Agent, or Firm*—Lucash, Gesmer & Updegrove, LLP

(57) ABSTRACT

Methods and systems for capacitive proximity and contact sensing employ one or more simple sensors (which may be a conductive fiber or pattern of conductive ink) in communication with a microcontroller. Digital signal processing executed by the microcontroller enables resolution enhancement, automatic and continuous calibration, noise reduction, pattern recognition and the configuration of virtual sensors capable of detecting how an object incorporating the sensors is being manipulated.

8 Claims, 10 Drawing Sheets

CAPACITIVE SENSOR SYSTEMS AND METHODS WITH INCREASED RESOLUTION AND AUTOMATIC CALIBRATION

CROSS-REFERENCE TO RELATED APPLICATIONS

The present application for United States Patent is based upon, and claims the priority of, the following U.S. Provisional Applications for Patent assigned to iRobot Corporation of Somerville, Mass., the assignee of the present application:

Ser. No. 60/259,360, filed Jan. 2, 2001, entitled "Toy Sensors"; and

Ser. No. 60/266,260, filed Feb. 2, 2001, entitled "Capacitive Sensor".

Each of these applications is incorporated by reference herein as if set forth in its entirety.

FIELD OF THE INVENTION

The present invention relates in general to the field of capacitive sensing, and in particular, to capacitive sensing methods and systems having increased resolution and automatic calibration, suitable for use in a wide variety of products and objects, including, but not limited to, toys and robotic apparatus.

BACKGROUND OF THE INVENTION

In the rapidly expanding universe of interactive toys, robotic devices and other objects, it has long been desirable to provide sensing that enables "intelligent" responses from the object and interactivity with the user. For example, toy manufacturers have long sought to provide baby dolls with "life-like" behavior. One simple approach has involved the use of pushbuttons or contact switches to sense presence or activity, such as squeezing, shaking, patting and the like. Interactive toys such as dolls, simulated animals or other creatures typically contain pushbuttons or squeeze switches to provide tactile sensing.

However, pushbuttons or similar switches suffer from a variety of limitations. They are not natural looking or feeling, and in a doll or toy setting, inhibit natural interaction (imagine, for example, a baby doll with pushbuttons). In addition, many sensing systems typical of the prior art cannot reliably detect touch through several layers of fabric or stuffing or plastics, and leave metallic or other potentially dangerous components exposed on the outside of the toy or other object. Still further, existing switching systems add complexity, cost and reliability problems.

In addition to pushbuttons, various other methods have been proposed for providing presence, contact or activity sensing in toys and other objects. Some examples are described in the following U.S. patents, incorporated herein by reference:

U.S. Pat. No. 4,272,916 Giordano et al.
U.S. Pat. No. 4,879,461 Philipp
U.S. Pat. No. 5,413,518 Lin
U.S. Pat. No. 5,682,032 Philipp
U.S. Pat. No. 5,730,165 Philipp
U.S. Pat. No. 6,039,628 Kusmiss et al.

Among these are a number of capacitive sensing techniques. For example, in U.S. Pat. No. 4,272,916 to Giordano et al. and U.S. Pat. No. 5,413,518 to Lin, capacitive sensing is applied to toys to enable proximity sensing. Examples of capacitive sensing elements and devices are available from Quantum Research Group, Ltd. of Pittsburgh, Pa. ("QProx"). In a "white paper" available at www.qprox.com/background/white_paper.shtml, and in the above-referenced U.S. Pat. Nos. 4,879,461; 5,682,032 and 5,730,165, all incorporated herein by reference, QProx describes various techniques, including a charge-transfer technology incorporated into specialized, single-purpose integrated circuits for capacitive sensing.

From a practical standpoint, however, while capacitive sensing is well-known, the components required by prior art methods and systems have generally been too expensive and complex for deployment in toys and other low-cost objects.

Accordingly, it would be desirable to provide simple, reliable, low-cost capacitive sensing methods and systems suitable for use in a wide range of toys, robotic devices or other objects.

It is also desirable to provide systems and methods that (for toys and dolls) can reliably detect touch through several layers of fabric or stuffing or plastic; do not require metallic or other potentially dangerous components exposed on the outside; present a natural "look" and "feel", and enable a natural, non-mechanical interaction.

Still further, in many applications it is also desirable to provide methods and systems capable of detecting not only touch, but patterns of touch, such as tickle, pet, bounce, burp, slap, or other. For example, it would be desirable to enable a toy to be able to detect and respond not only to whether the child is playing with the toy, but how the child is playing with the toy.

More particularly, it is desirable to provide advanced signal processing that supports the creation of virtual sensors (e.g., a proximity sensor; a tickle sensor; a pet sensor) that compile and synthesize a wide range of information from one or more simple physical sensors. This functionality would further support recognition and "learning" of signal patterns or signatures. In a toy example, this would provide a powerful interactivity capability, since the toy would know how it is being played with (pet, slap, etc.) and even learn the interactivity patterns of its owner.

It is also desirable to provide such functionality inexpensively, using existing components where possible, with high resolution and automatic and continuous calibration, and with noise rejection to reduce the incidence of false positives (e.g., false detection of touch or touch patterns).

SUMMARY OF THE INVENTION

The present invention provides and enables the foregoing features, benefits, and advantages, among others. In one aspect, the invention comprises low-cost methods and systems for capacitive proximity and contact sensing, using a simple sensor (which may be a conductive fiber or pattern of conductive ink) integrated with a microcontroller, with advanced digital signal processing that provides resolution enhancement, automatic and continuous calibration, noise reduction, and pattern recognition.

Basic Hardware Configuration

In one aspect, the capacitive sensing system includes a power source to supply electrical charge; a microcontroller, in communication with the power source and having at least one digital logic input/output (I/O) pin; a conductive sense element (which may be a plate, surface, wire, thread or conductive ink pattern) coupled to the port, and a resistance element coupled to the sense element. A variable capacitor configuration is formed by the sense plate and an object (such as a human hand) in proximity to the sense plate, and the capacitance thereof is representative of the proximity of the object to the sense element. After the conductive sense element is charged by a voltage placed on the I/O pin, the time (or other parameter) necessary to discharge the sense element through the resistance element can be measured to determine the capacitance, and thus the proximity of an object to the sense element. By digitally processing the signals on the I/O pin, the system can provide resolution enhancement, automatic and continuous calibration, noise reduction and pattern recognition. In particular, the system can be made sensitive to very small changes of capacitance, despite large sensor offsets; relatively insensitive to random sensor noise caused, for example, by nearby electrical circuitry; self calibrating at the factory to compensate for variations in chip specifications and other manufacturing tolerances; and auto-calibrating to compensate for drift over time.

Measurement

In one aspect of the invention, capacitance is measured by measuring the time required to discharge the capacitance through a resistance using the above-described configuration of microcontroller I/O pin, sense element and resistor. In accordance with this aspect, a method includes: setting the I/O pin to OUTPUT mode with its state HIGH, thus charging the capacitor to the supply voltage of the microcontroller; then setting the I/O pin to INPUT mode (referred to hereinafter as changing the direction of the I/O pin or turning around the I/O pin); and then measuring the time required for the voltage measured at the pin (V.pin) to fall below the threshold voltage of the microcontroller. The measured discharge time is approximately proportional to the resistance of the resistor (R.discharge) times total capacitance (C). Since the microcontroller uses a stable clock, digital signal processing techniques are employed to make high-resolution measurements of time. In this way, small changes in capacitance (C) can be reliably measured.

In another aspect of the invention, capacitance is measured by counting pulses required to discharge the capacitance through a resistance. By counting pulses of fixed magnitude, a measure of capacitance is obtained. The digital signal processing techniques described herein are equally applicable to capacitance measurements derived thereby.

Auto-Calibration

Methods of automatic calibration in the capacitive sensing system include the steps of detecting, at power-up, a first stable value; designating that first detected stable value as an initial calibration value; incrementing, at a fixed interval, the initial calibration value; continuously examining detected values; and when a new stable value lower than the current calibration value is detected, replacing the current calibration value with the new stable value.

Resolution Enhancement

In yet another aspect, methods to increase resolution of measurement in the capacitive sensing system include the steps of taking multiple timing-based measurements of a given value using different timing offsets, and then averaging across the multiple timing-based measurements. In a particular practice of the invention, a measurement timing loop in the microcontroller is defined to have a characteristic resolution of 3T (T being one microcontroller clock cycle), through the use of a single ADC (add with carry) instruction per loop step. Then, the timing loop is run iteratively with fixed delays of 2T, 3T, or 4T (effectively a time shift of −1T, 0 or +1T respectively) added between the instruction that changes the direction of the I/O pin and the beginning of the counting loop. Next, an average is taken of the three measurements thereby obtained, resolving the total loop time to the nearest T.

Pattern Recognition

Digital signal processing enables the creation of virtual sensors capable of using the sense circuitry to detect patterns of proximity or contact. In one aspect, a touch sensor detects contact with or proximity to the sense element, by detecting whether a raw value obtained from the sense element is above a baseline calibrated value by a threshold amount for a certain number of successive measurements. If it is, then TOUCH is detected. If the raw value falls below the sum of the calibration value and the threshold amount, no touch is detected.

In another aspect, a hold sensor detects a sustained touch over an extended period of time, by detecting whether the raw value is above the baseline calibrated value by a threshold amount, and if it is, then increasing an activation level of the sensor; or if the raw value is below the baseline calibrated value, decreasing the activation level of the sensor. If the activation level exceeds a trigger value, HOLD is detected; otherwise, no HOLD is detected.

In still another aspect, a slap sensor detects a quick touch or slap, by maintaining a touch/no-touch history over a number of sample times; and then comparing this temporal pattern to a pattern stored in a lookup table that indicates whether the detected pattern is valid as a slap, and in response thereto, signaling a SLAP.

A rhythm sensor detects whether a particular pattern of touch falls within a set of predetermined constraints describing duration of touch and time between touches. The rhythm sensor operates by detecting rising and falling edges as defined in the activity sensor, above. The sensor has an activation level that is decayed at a fixed rate. At a rising edge, the sensor starts a timer. At the next falling edge, it determines whether the duration of the touch, according to the timer, is within a predefined range. Then, at the next rising edge, the sensor again examines the time to determine whether the period (time between touches) is also within range. If both conditions are met, the activation level of the sensor is incremented by a fixed attack plus the period.

A pet sensor detects a petting contact and distinguishes it from other types of touch (and from noise), using techniques similar to the rhythm sensor, but also including a bandpass filter to preprocess the signal before the detection of rising and falling edges. In this preprocessing, the raw capacitive sensor values are passed first to a low-pass filter. The output of the low-pass filter is then filtered again through a high-pass filter. In applications that can afford the use of a small amount of extra memory for the filtering operations, this results in significantly better performance in distinguishing a true petting motion from other kinds of touch and spurious noise.

A sequence sensor can employ three capacitive sensors that detect a sequence of edges, thereby differentiating between a forward stroke contact from a backward stroke contact (as might be useful in a simulated cat, which would reward stroking in a particular direction).

A proximity sensor produces a value that corresponds to the proximity of a hand or other conductive object to the sense element. The proximity sensor employs a smoothed, noise-reduced capacitive sensor reading to represent proximity. This is accomplished by keeping a running average of past values, and averaging in each new value as it is read. This averaged value is the proximity. Other virtual sensors are described hereinafter.

Objects Using Sensing System

In another aspect, the invention comprises an object having a microcontroller in communication with multiple sense elements like that described above, the microcontroller being capable of executing digital signal processing steps to provide resolution enhancement, automatic and continuous calibration, noise reduction and pattern recognition. The object can be, for example, a toy or robotic apparatus. The pattern recognition aspect supports the creation of virtual sensors including, in particular examples, sensors of touch, tickle, pet, slap, bounce, squeeze and other manipulations. These virtual sensors can be synthesized from a single, simple sense element or by collection of signals from multiple sense elements in communication with the associated microcontroller.

Other Aspects and Advantages

In a further aspect, methods and systems are provided for sensing the presence of a non-conductive element interspersed between the sense element and electrical ground. This can be useful, for example, in sensing the relative position of an articulated portion of a robotic object, such as the position of the head/neck portion of a robot.

The invention provides numerous technical advantages. For example, the sensor utilizes existing I/O and stable clock source of standard, low-cost microcontrollers already present in many "smart" objects; and since the system uses only limited microcontroller resources (a sense element requires only a single I/O pin), one microcontroller can support many sensors (eight sensors can be operated from a typical 8-bit digital logic port). The hardware configuration of the invention requires only one external resistor per sensor, further reducing cost; and no variable frequency oscillator, frequency divider, or specific sense-plate geometries or materials are required. Integrated capacitive sensing and signal processing capabilities are thus provided with far fewer components and at lower cost than previously possible. The sensors are automatically and continuously calibrated, and integrated noise rejection reduces the incidence of false positives.

In practical applications, such as toys, the invention can reliably detect touch through several layers of fabric or stuffing or plastic; does not require metallic or other potentially dangerous components exposed on the outside; can be natural looking and feeling, thus enabling a more natural, non-mechanical interaction than that provided by conventional mechanical switches. Still further, the invention can detect not only touch, but also patterns of touch, such as tickle, pet, bounce, squeeze, burp, slap, or other. In a toy, this enables detection not only of whether a child is playing with the toy, but how the child is playing with the toy. The virtual sensor aspects of the system (e.g., a proximity sensor; a tickle sensor; a pet sensor) can compile and synthesize a wide range of information from one or more simple physical sensors (such as a pattern of conductive ink); and enable recognition and "learning" of signal patterns or signatures. This enables a powerful interactivity capability, since the toy or other object "knows" how it is being manipulated (squeeze, tickle, pet, slap, or other) and can even "learn" the interactivity patterns of its user(s).

The following Detailed Description provides additional information and further examples.

BRIEF DESCRIPTION OF THE DRAWINGS

The invention, as well as features and advantages thereof, will be more readily understood from a reading of the following detailed description of various examples thereof, and by reference to the accompanying drawings, wherein.

DETAILED DESCRIPTION

The following description and accompanying drawings describe and illustrate various embodiments of the methods and systems of the present invention. It will be understood that while several examples shown are directed to toys or robotic devices, the invention is applicable to a wide range of products and objects requiring reliable, inexpensive capacitive sensing with high resolution and automatic calibration.

Basic Circuitry

Figure 1A:
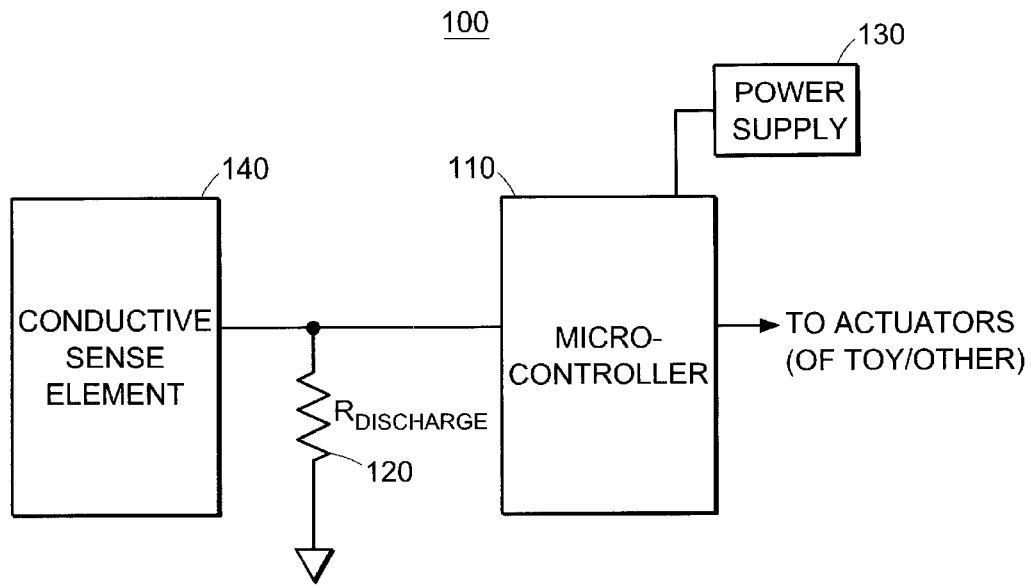
FIGS. 1A–1F are a schematic drawings showing electrical circuitry employed in embodiments of the present invention.

As a general matter, capacitive sensors operate by detecting a change in capacitance that occurs when a conductive body, such as a human hand, approaches or contacts a sense element constructed from a conductive material. FIG. 1A shows one example of a capacitive sensing system constructed in accordance with the invention. As shown therein, capacitive sensing system 100 can consist of a microcontroller 110, a high-value resistor 120 (typically around 3.3M ohms, but left to the selection of the implementer), a power supply 130, and a conductive sense element 140. The power supply can be a DC battery or other power source of conventional design, and need not be further described herein. The microcontroller 110 can be a standard, conventional, low-cost complementary metal-oxide semiconductor (CMOS) or other microcontroller element typical of those present in an interactive toy or other "smart" device. By way of example and not limitation, the system can use a Sunplus Technology SPC series microprocessor (with an 8-bit CPU running at 4-MHz clock), or similar device. (In some applications, a protection resistor of perhaps 10 Kilohms (not shown) may be inserted between the I/O pin and the sense element.) The invention uses signal processing methods described below to exploit the existing digital I/O capabilities and stable clock oscillator of a standard CMOS or other microcontroller, to provide an inexpensive but reliable sensing system having enhanced resolution and automatic calibration. In the configuration shown in FIG. 1A, the conductive sense element 140 is electrically connected to one digital I/O pin of the microcontroller. This arrangement allows for 8 separate sensors to be connected to a single 8-bit port. (See, e.g., FIG. 1F.)

The capacitive sense element can be constructed from any moderately conductive material, in any shape or size suitable for the application. Since the user of the object need not even make electrical contact with a capacitive sensor to trigger it, contact issues are not a concern. In addition, capacitive sensors are highly versatile: they can be used as touch sensors or proximity sensors and can also, in the present invention, be used to detect many different patterns of touch or proximity. In fact, in the present invention, a single capacitive sensor can detect all of these aspects simultaneously. Capacitive sensors are also inexpensive—they can be manufactured for pennies, and the only additional hardware required is a single resistor. Additional information regarding the sense element is set forth below. The sense element could also consist of metallic paint or other conductive inks or coatings (widely available and commonly used for RFI shielding in plastic-cased PCs and other applications); metallized Mylar film that could be cut to size as desired; conductive plastic (such as black plastic anti-static materials or the like); or conductive foam. Conductive foam is appealing in some applications (e.g., plush toys) because it is soft and compressible. Another suitable sense element can be formed from a grid of conductive ink, with the spacing of the grid on the order of the size of a human finger.

Basic Method of Operation

Figure 2A:
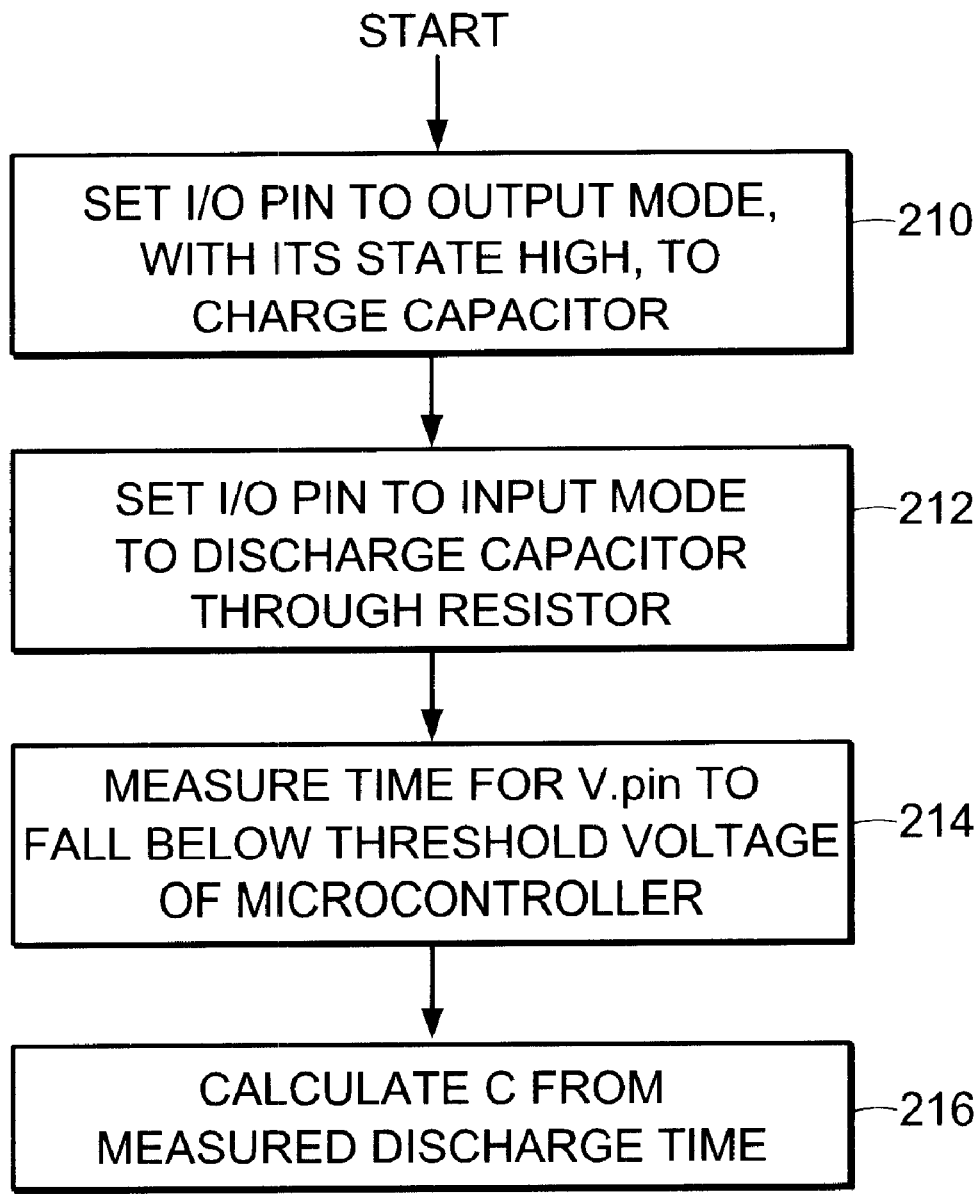
FIGS. 2A–2D are flowcharts of method steps utilized in conjunction with the invention.
Figure 2B:
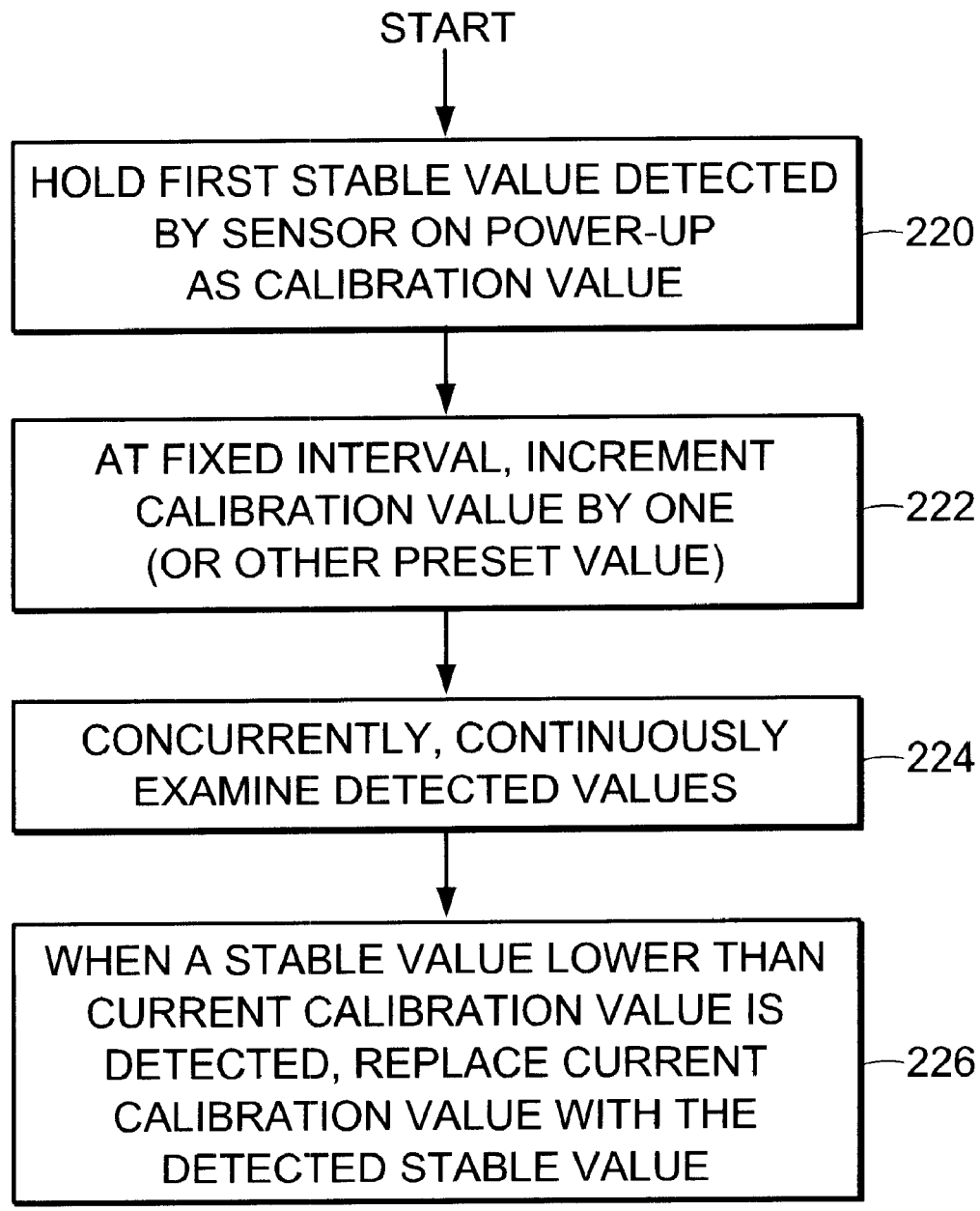

In one practice of the invention (FIG. 2A), the capacitive sensor system operates by measuring the time it takes to discharge an unknown capacitor through a known resistor. In another practice of the invention (FIG. 2D), the system operates by measuring the time required to charge the unknown capacitor through a known resistor. The unknown capacitor is effectively formed by the sense element (which itself has capacitance), or by the sense element in conjunction with a human hand or other object placed near the sense element. In general, the presence of a hand or other object causes an increase in capacitance and a corresponding increase in discharge (or, alternatively, charge) time. In one practice of the invention, the capacitor discharge (or, alternatively, charge) time is measured by examining the state of the associated I/O pin with a software timing loop. Thus, as shown in the flowchart of FIG. 2A, the basic operation of the illustrated system is as follows:

1) Set the I/O pin to OUTPUT mode with its state HIGH (step 210). This charges the capacitor to the supply voltage of the microcontroller.
2) Set the I/O pin to INPUT mode (step 212) and measure the time required for V.pin to fall below the threshold voltage of the microcontroller (step 214).
3) Calculate C from measured discharge time (step 216).

The measured discharge time is approximately proportional to R.discharge x (C.pin+C), or (R.discharge×C.pin)+(R.discharge×C). The first term is a constant and is subtracted out as a "calibration" value. The second term will be proportional to the sensed capacitance. Since a conventional microcontroller contains a stable clock, the invention exploits this clock source, using digital signal processing techniques to make high-resolution measurements of discharge time as described below. In this way, small changes in C can be reliably measured.

(Alternatively, in an embodiment using measurement of charge (rather than discharge) time (FIG. 2D), the I/O pin is initially set, as an OUTPUT, to ZERO, discharging the capacitor (step 600). Then, execution of a microcontroller instruction causes the I/O pin to be an INPUT, and the timing loop is initiated (602). When the pin reads as digital ONE, the capacitor has charged (to the input threshold voltage of the I/O pin), and the timing loop is terminated (604). Capacitance can then be derived from the measurement of charge time (606).

It will be understood that for the implementations described herein, the microcontroller must have at least one pin capable of functioning as both input and output. In the described operations, the pin starts as an OUTPUT (with a digital HIGH), charges the capacitor to system voltage (e.g., 5 Volts), then "reverses the pin" to function as an INPUT. As long as C has a voltage about input threshold, it will read as a digital ONE. When it falls below, it will read as a digital ZERO.

Figure 1B:
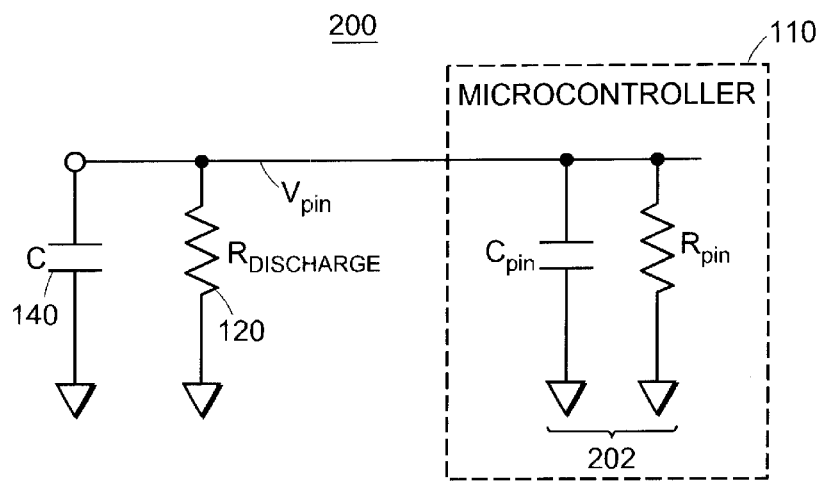

FIG. 1B shows another version of a capacitive sensor circuit 200, including a microcontroller I/O pin 202 (represented by R.pin and C.pin, the effective resistance and capacitance present when that pin is configured as an INPUT). For a typical CMOS device with low input leakage current, the equivalent R.pin is much higher than R.discharge and can, for the most part, be disregarded. The value C.pin is significant, however, as this appears as background capacitance which must be effectively subtracted out from the sensor measurement to determine the value of C, the effective capacitance created by the presence of a person's hand or body near the conductive sense element. In general, the nearer a hand to the conductive sense element, the higher the capacitance. The presence of an insulating dielectric (other than air) between the conductive sense element and a hand also increases the effective capacitance. As described below, the value of C is processed by software running on the microcontroller to yield high-level information about touch, proximity or patterns of touch/proximity. Besides the capacitance C.pin at the microcontroller's I/O pin, additional background capacitance comes from the circuit board, any connecting wires, and the sense element itself. The presence of all these sources of background capacitance results in the need for automatic calibration (analogous to the tare adjustment on a weight scale). Auto-calibration, described in detail below, is therefore a feature of the invention.

Pulse-Counting Circuit

Figure 1C:
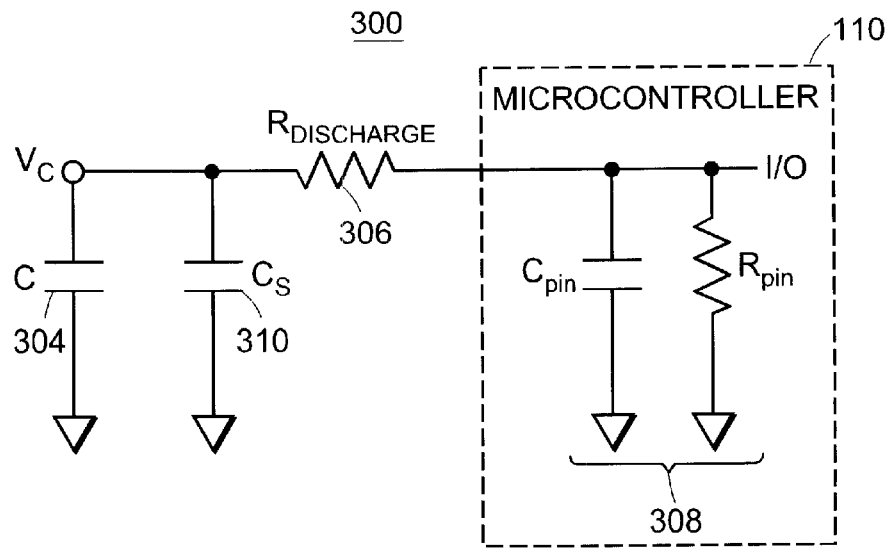

In another embodiment of the invention, instead of measuring the time required to discharge C, we instead count the number of short discharge pulses required to discharge C. One (by no means the only) example of suitable circuitry 300 for this aspect of the invention is depicted in FIG. 1C. As shown therein, the capacitive sensor resistor 306 (R.discharge) is connected from the conductive sense element 304 to the microcontroller I/O pin 308 (represented schematically by C.Pin and R.pin) instead of to ground G. With this arrangement, C discharges through R.discharge only when the I/O pin 308 is set to the OUTPUT mode with its state LOW. When the I/O pin is in the INPUT mode, V.pin remains constant. In this way, the conductive sense element 304 can be discharged in small increments. In particular, when the I/O pin 308 is an INPUT mode, the voltage at the conductive sense element 304 is measured using the microcontroller 110. When the I/O pin 308 is held HIGH for a selected time, perhaps 500 microseconds, the conductive sense element 304 will be fully charged. If the pin is pulsed LOW (and set to the INPUT mode between pulses), the conductive sense element 304 will discharge in small increments, one increment per discharge pulse. This arrangement provides advantages in that microcontroller 110 interrupts can be allowed between discharge pulses, since the conductive sense element 304 (cap-sensor) voltage remains approximately stable when the I/O pin 308 is in the INPUT mode. Alternatively, it may be convenient to integrate interrupts and capacitive sensing, by arranging for one discharge pulse to take place at each interrupt (typically at 8 KHz). In addition, in the illustrated configuration using pulse counting, there is no need for the other pins of a microcontroller port to remain LOW during capacitive sensing. Conversely, an entire port of capacitive sensors can be counted concurrently instead of sequentially, thus saving significant CPU time.

Referring again to FIG. 1C, it will be noted that C.s is a "swamping" capacitor (see reference numeral 310). Its value should be much greater than that of C.pin, probably on the order of 1.00 picofarads. This is necessary to minimize the effect of C.pin on V.pin, which is intended to match V.c when the I/O pin 308 is in the INPUT mode. At the moment the I/O pin 308 is switched from the OUTPUT mode to the INPUT mode, C.pin is completely discharged, while the conductive sense element 304 may be only partially discharged. Without the swamping resistor 310, charge would flow from the conductive sense element 304 to C.pin according to the ratio of the capacitances, resulting in V.pin becoming only a fraction of V.c (in particular, V.pin would be V.c X (C/C.pin). However, with the addition of the swamping resistor 310, V.pin will be almost equal to V.c during the INPUT mode, since very little charge will flow from the parallel combination of the swamping resistor 310 and the conductive sense element 304 to C.pin. While the total number of discharge pulses will be increased (i.e., C.s becomes part of the background calibration capacitance), the sensitivity of the measurement will not be affected.

The above-referenced capacitive sensor feature of the invention can achieve an effective measurement resolution of one processor clock cycle. If discharge pulses could be made to last for one clock cycle, then pulse counting would achieve the same sensitivity. Unfortunately, this is not possible directly, because each processor instruction takes several clock cycles; but the effect can be simulated as follows. Instead of a single discharge pulse one clock cycle long, combine a discharge pulse of perhaps 20 clock cycles with a charge pulse of 19 clock cycles. This yields the effect of a discharge pulse of one clock cycle.

Variant

Figure 1D:
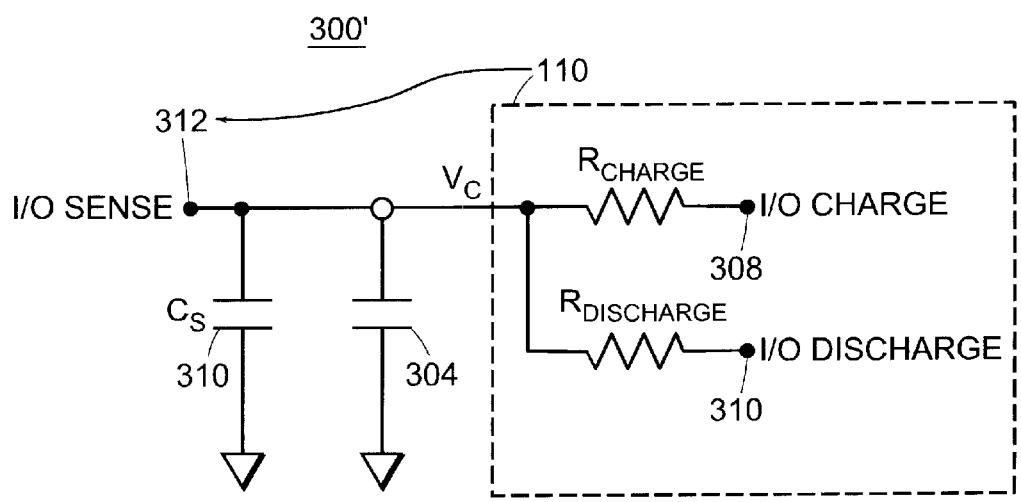

FIG. 1D shows a variation of the pulse-count circuit (identified by reference numeral 300') that uses three I/O pins 308, 310, 312: one (I/O pin 308) to charge the conductive sense element 304, one (I/O pin 310) to discharge the conductive sense element 304, and one (I/O pin 312) to read V.c. In this configuration each "discharge" pulse actually consists of a discharge pulse through R.discharge followed by a charge pulse through R.charge. By adjusting the ratio of R.discharge to R.charge, the effective charge time can be made arbitrarily small, thus increasing the resolution of the pulse-count measurement.

Figure 1E:
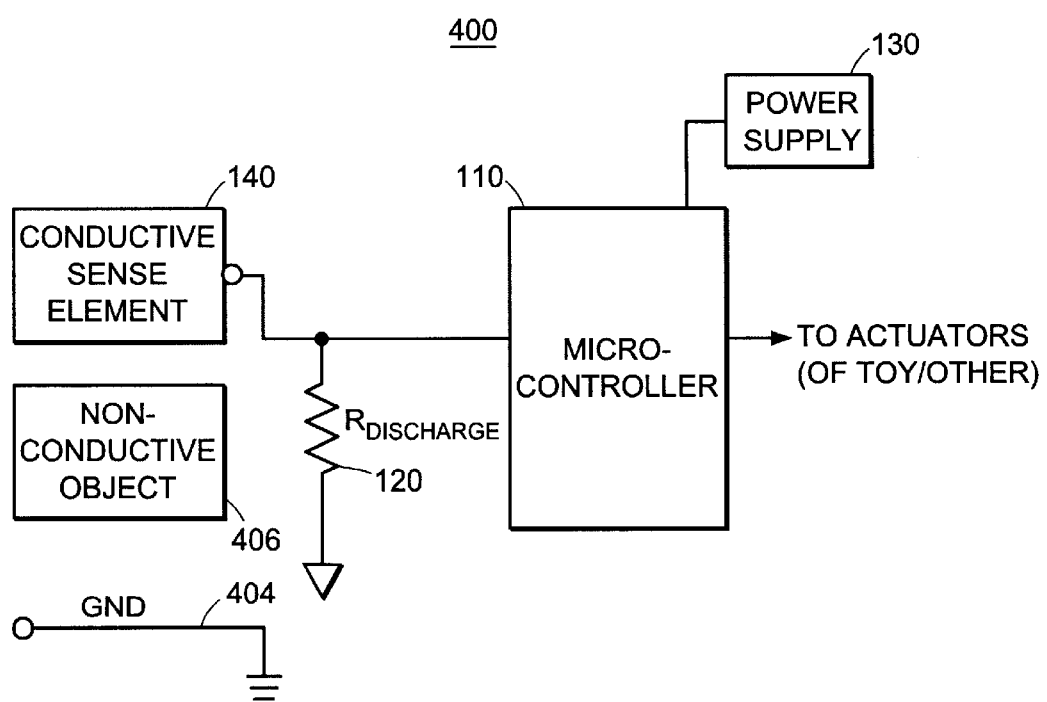

In another embodiment, depicted in FIG. 1E, circuitry 400 is configured so that the conductive sense element 140 is able to detect the presence of a non-conductive objects 406 between the conductive sense element 140 and a ground element 404.

Objects Incorporating the Sensing System

Figure 1F:
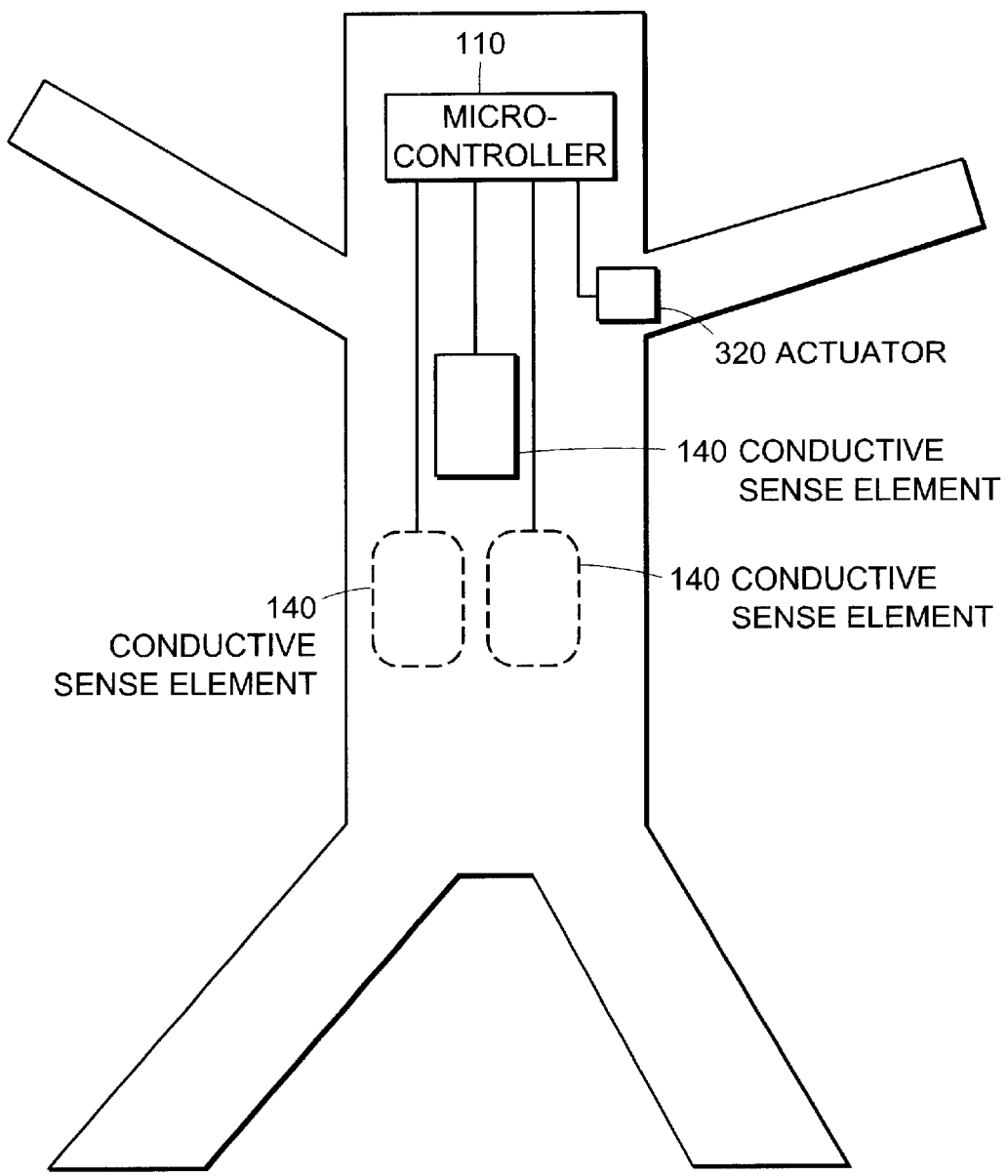

As shown in the schematic diagram of FIG. 1F, toys, dolls and other objects can incorporate a sensing system in accordance with the invention. FIG. 1F shows a schematic doll having a microcontroller 110 in communication with a power source (not shown), a plurality of sense elements 140 distributed about the doll, and an actuator 320 that can be used, for example, to move the doll's limbs in response to detected patterns of touch. As noted elsewhere herein, the sense elements can be flexible conductive textiles, threads or ink patterns, suitable for use in a wide range of toys, dolls, consumer products or other objects.

Auto-Calibration

In accordance with a preferred practice of the invention, the capacitive sensors continuously auto-calibrate, using a mechanism that relies on the fact that the value seen by the conductive sensing element (hereinafter the "sensor") is always equal to or higher than the baseline, no-touch value. Referring now to the flowchart of FIG. 2B, the auto-calibration operates as follows: The initial calibration value is the first stable value detected by the sensor (step 220) on power-up. At a fixed interval, this value is "leaked up", that is, incremented by one (or another preset value) (step 222). A separate process continuously looks at detected values (step 224), and when it encounters a stable value that is lower than the current calibration value, it replaces the current calibration value with this detected stable value (step 226). If the baseline value drifts down, the calibration value will be immediately updated accordingly; if the baseline value drifts up, the calibration value will leak up to the new baseline value as no lower values will be detected to force it down.

Pattern Recognition

Figure 3:
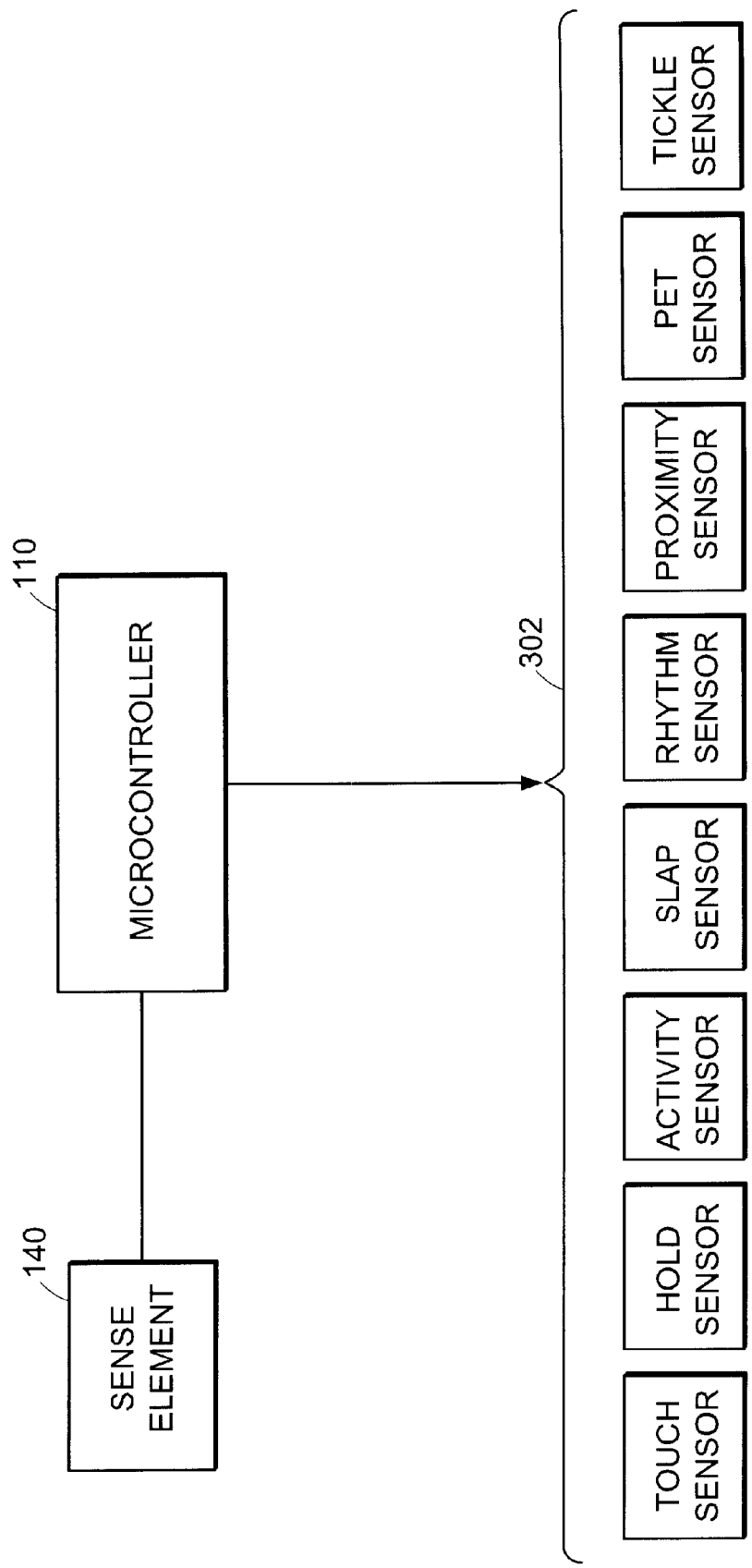
FIG. 3 is a schematic diagram illustrating virtual sensor processes within the microcontroller.

As noted, in addition to detecting proximity and touch, the present invention can be used to detect a pattern of play (i.e., how a child is playing with the toy). In one embodiment, multiple sensors can be used, and multiple patterns can be detected. In a particular embodiment, multiple ways are used to process "raw" capacitive sensor data to detect different patterns. These may include TOUCH, HOLD, ACTIVITY, SLAP, RHYTHM, PROXIMITY and others, each of which can be a software application in the microcontroller, as described below and illustrated in FIG. 3 where reference numeral 302 indicates generally these "pattern recognition" software applications.

Touch Sensor

The touch sensor detects whether or not the capacitive sensor is being touched. If the raw value is above the baseline calibrated value by a threshold amount for a certain number of successive measurements, touch is detected. If the raw value falls below the calibration value plus the threshold amount, no touch is detected.

Proximity Sensor

The proximity sensor produces a value that corresponds to the proximity of a hand or other conductive object to the capacitive sense element. The proximity sensor simply uses a smoothed, noise-reduced capacitive sensor reading to represent proximity. This is accomplished by maintaining a running average of past values, and averaging in each new value as it is read. This averaged value is the proximity.

Hold Sensor

This sensor detects a sustained touch over an extended period of time. In one embodiment, the hold sensor uses a leaky integrator (in the form of a software application in the microcontroller) to detect a sustained touch (or hold) over a period of time. If the raw value is above the baseline calibrated value by a threshold amount, the activation level of the sensor is increased; if the raw value is below the baseline calibrated value, the activation level of the sensor is decreased. If the activation level exceeds a trigger value, HOLD is detected; otherwise, no HOLD is detected.

Activity Sensor

The activity sensor looks for degree of activity near a capacitive sensor over a period of time, such as might be produced by tickling. In particular, the sensor looks for rising and falling edges, defining a rising edge as two successive measurements that differ by more than a certain amount when the last edge detected was a falling edge; and defining a falling edge as two successive measurements that differ by more than a certain amount when the last edge detected was a rising edge. The sensor then uses a "leaky integrator" that is incremented when a rising edge is detected.

Slap Sensor

The slap sensor detects a quick touch or slap. It operates by maintaining a continuous touch/no-touch history over a number of sample times. (The touch threshold for a slap may be set to a higher or lower value than for a normal touch, as appropriate. For example, since a slap is more forceful, it may produce larger changes in capacitance. Thus, a higher threshold may help to distinguish a slap from a normal touch.) This temporal pattern is checked in a lookup table that indicates whether it is valid as a slap. As an example, three cycles OFF followed by four cycles ON followed by two cycles OFF would be a valid slap pattern. This technique of temporal pattern matching can be extended to detect other types of touches. It has the advantage of using little CPU time in the microcontroller, since the intelligence is encoded into the pattern table, which is generated at the time the target code is compiled. This method can also be used to detect a variety of patterns—two or three quick successive touches, a quick touch followed by a longer touch, etc.

Rhythm Sensor

This detects whether a particular pattern of touch falls within a set of constraints describing duration of touch and time between touches. The rhythm sensor works by looking at rising and falling edges defined as in the activity sensor, above. The sensor has an activation level that is decayed at a fixed rate. At a rising edge, the sensor starts a timer. At the next falling edge, it determines whether the duration of the touch, according to the timer, is within a predefined range. Then at the next rising edge, the sensor looks at the time again to determine whether the period (time between touches) is also within range. If both conditions are met, the activation level of the sensor is incremented by a fixed attack plus the period. Adding the period to the attack allows touch rhythms at the slower end of the acceptable range and at the higher end of the acceptable range to trigger the sensor in a similar number of repetitions, despite the fixed decay. The rhythm sensor can detect and differentiate between many rhythmic patterns of touch: widely spaced short touches, closely spaced short touches, etc.

Pet Sensor

In one embodiment, the pet sensor uses the signal processing of the rhythm sensor described herein, but-with the additional aspect of a bandpass filter to preprocess the signal before the detection of rising and falling edges. In this preprocessing, the raw cap-sensor values are passed first to a low-pass filter. The output of the low-pass filter is then filtered again through a high-pass filter. In applications that can afford the use of a small amount of extra memory for the filtering operations, this results in significantly better performance in distinguishing a true petting motion from other kinds of touch and spurious noise.

In the most general implementation of a pet sensor, every ordered pair of capacitive sensors can have a measured period that contributes to a leaky integrator input. If there are three sensors, for example, nine different periods can be measured: 1-1, 1-2, 1-3, 2-1, 2-2, 2-3, 3-1, 3-2, and 3-3. As a practical matter, a reasonably robust sensor can be made by measuring only the periods for 1-1, 1-2, and 2-3. Other variations are possible and are left to the implementer.

Sequence Sensor

The sequence sensor can detect and differentiate between stroking contacts in different directions (such as differentiating between a forward stroke and a backward stroke), employing three capacitive sensors that detect the sequence of edges (e.g., looking for rising edges from no-touch to touch states), with appropriate digital signal processing. The sequence can be stored in a register and examined for a "good sequence" (in contrast to an "incorrect sequence" representative of "wrong-way" contacts). When the good sequence is detected, an associated good sequence signal is generated. This can be useful in applications such as a simulated cat, wherein a stroking movement in a particular direction is rewarded. This function would be extremely difficult to achieve with simple switches.

Tickle Sensor

The tickle sensor can employ a touch/no-touch transition-counting method. In many applications, a "touch" should not require more than one sample above threshold. The optimal touch threshold for tickle transitions might not be that selected to detect normal touch. Threshold selection is left to selection by the implementer.

Personalizing Functionality—"Entrance"

The virtual sensors described herein (and shown in FIG. 3) can be used to produce a system that "learns" a user's particular pattern of touch, so that, for example, only a creature's "owner" would know how to "entrance" the creature. This can be implemented by defining, as variables, the values that determine passband for ON-time and period. In operation, the system would start with wide passbands, while maintaining a long-term average and, where appropriate, standard deviation or other measures of the spread of the sample data, for ON-time and period of what a given user generates, within the passband, when touching the object. As more data is acquired, the passbands can be gradually narrowed in accordance with the spread of the data, centering on the average values actually measured. If the user is fairly consistent in his or her pattern of touch, the effect will be to have the object "learn" that pattern of touch to elicit a particular play pattern (such as to enter a "trance state").

Improving Resolution

For a given charging resistor, the minimum measurable change in capacitance will be determined by the resolution of the software timing loop. While the value of the charging resistor can be increased to cause a corresponding increase in the change in charge time associated with a given change in capacitance, that increased resistance also increases the susceptibility of the circuit to electrical noise, due to impedance effects. Since resolution depends on the timing loop, we next examine its effects. In one practice of the invention, the unrolled software timing loop has a resolution of 7 processor clock cycles, or 7T, where T is one clock cycle. Using a typical microcontroller 4 MHz clock source, for example, T is 250 nanoseconds, so 7T is 1.75 microseconds. With a 3.9 Megohm charging resistor, for example, one might measure "no-hand" (i.e., no human contact with or proximity to the sense element) loop counts in the range of 30 (i.e. 52.5 microseconds, corresponding to about 15 picofarads). When a hand is placed on a half-inch thickness of fabric batting over the sense element, the typical change was only about 1 count, or 3% (i.e. 1.75 microseconds or about 0.5 picofarads). Thus, it is desirable to attain better resolution.

Accordingly, in a preferred embodiment, a digital timing and measurement technique is used to yield a resolution of 1T (in this example, 0.25 microseconds). This technique involves two aspects. First, the timing loop (referring now to FIG. 2B) is defined to have a characteristic resolution of 3T, through the use of a single ADC (add with carry) instruction per loop step. Secondly, the addition of a selected delay of 2T, 3T or 4T—effectively a time shift of −1T, 0, or +1T—between the instruction that changes the direction of the I/O pin and the beginning of the counting loop, resolves the total loop time to the nearest T. In effect, we shift the starting point of the counting loop by one clock cycle in each direction; measure three ways (by 0 shift, +1 and −1 shift), and then average the measurements to obtain a resolution down to 1T.

Figure 2C:
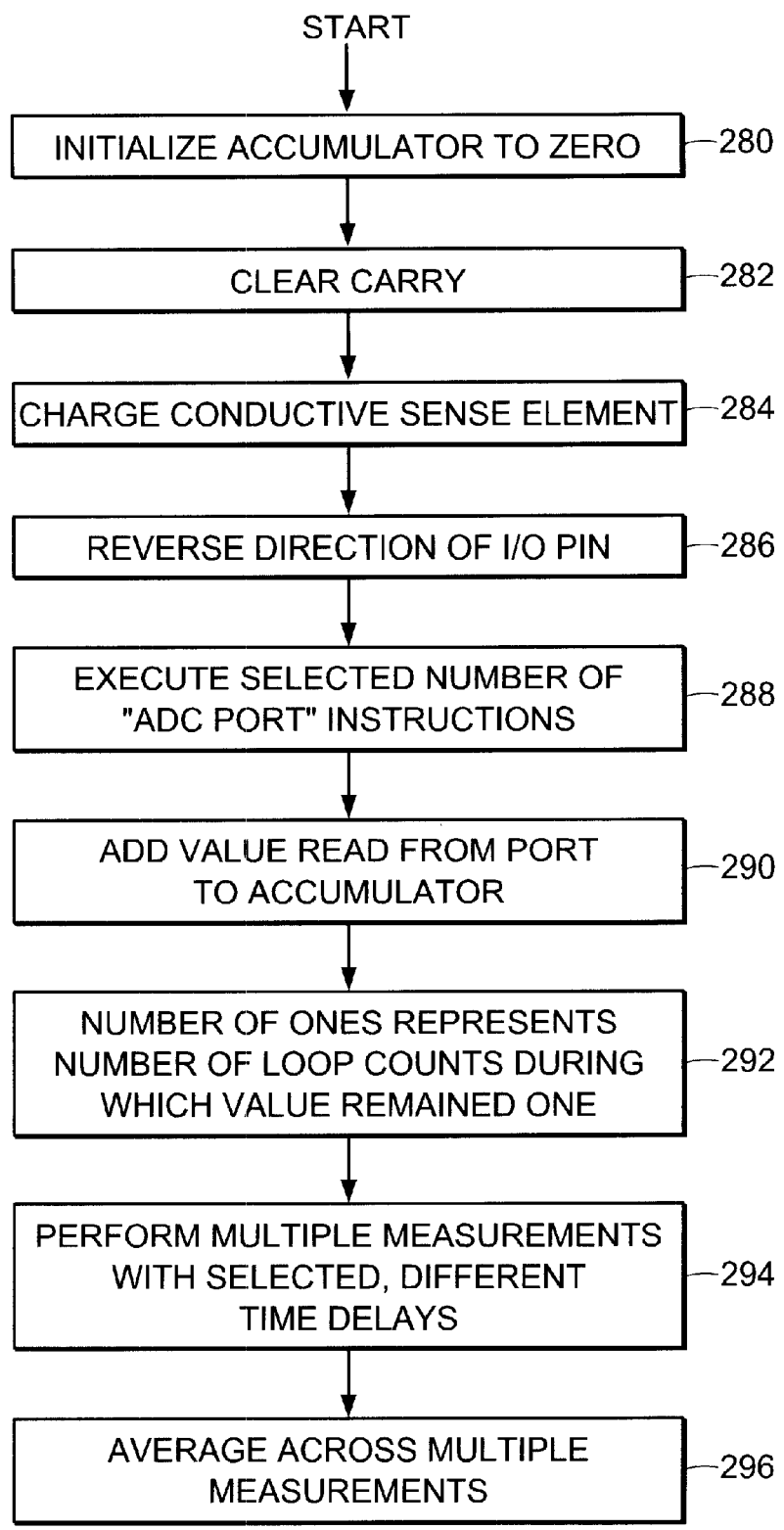
Figure 2D:
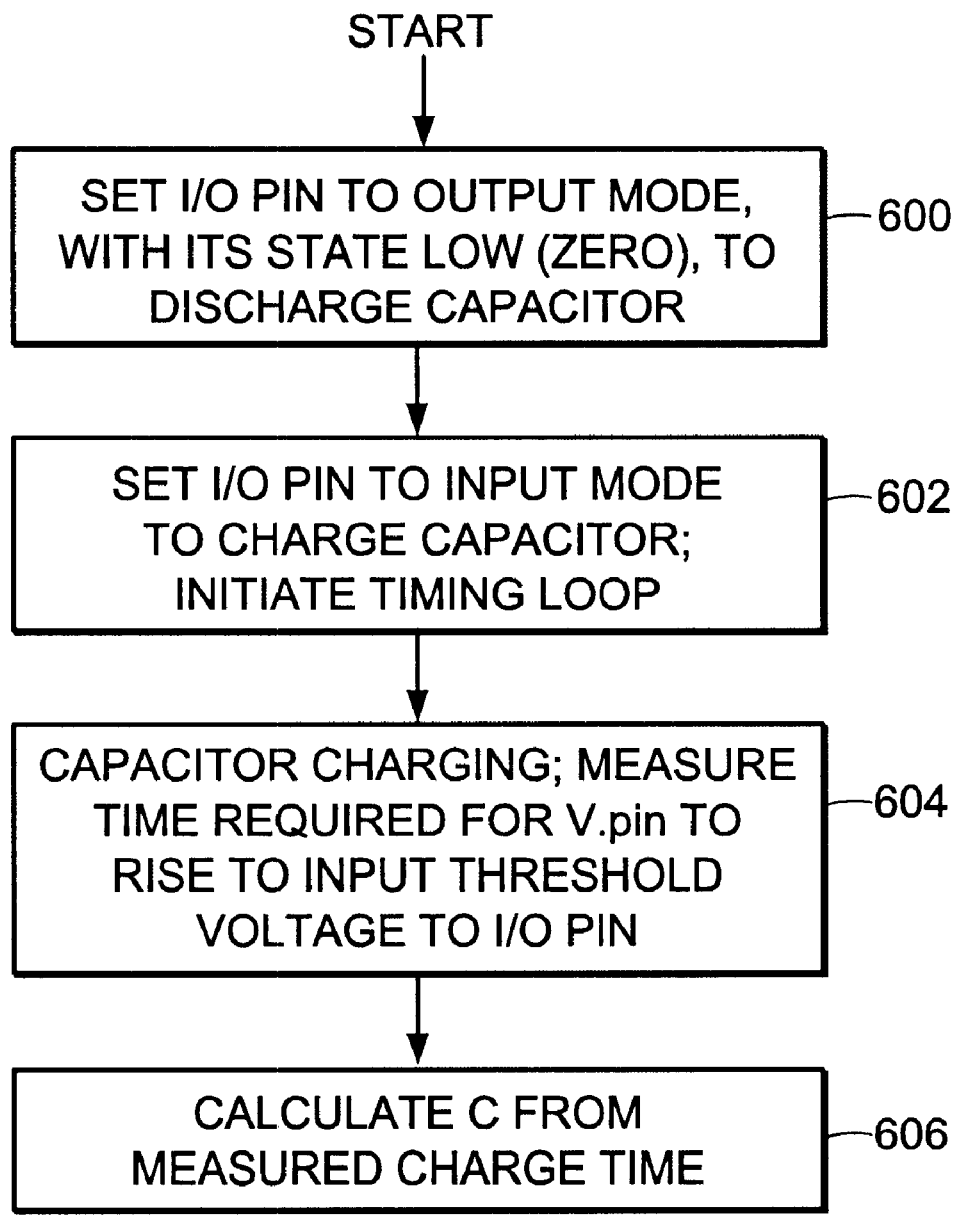

To demonstrate the effect of this technique, consider a capacitive sensor on bit 0 of a port (see, e.g., FIG. 1A), with nothing on the other port pins. As shown in the flowchart of FIG. 2C, the system microcontroller first initializes the accumulator to ZERO in step 280, clears CARRY in step 282, charges the conductive sense element in step 284, and reverses the direction of the I/O pin in step 286 (i.e., changing output to input, or input to output). Next, the microcontroller executes a preselected number, e.g., 63, of "ADC PORT" instructions in step 288. This adds the value read from the port to the accumulator. As long as the input bit is ONE, the ADC instruction increments the accumulator by ONE in step 290. When the bit changes to a ZERO, the ADC has no effect. After 63 ADCs, then, the number of ONEs in the accumulator is determined in step 292, where the number of ONEs represents the number of loop counts during which the value remained ONE. Since the ADC takes 3T, the loop resolution is 3T. (It is also desirable to maintain a ZERO on the input bits of the sensors not currently being timed. This happens automatically in the measure discharge-time embodiment, since the discharge resistors are always connected to ground.). In step 294, steps 280 through 292 are repeated using selected, different time delays. Finally, in step 296 the multiple measurements from step 292 are averaged to obtain a resolution down to 1T.

It will be seen that using combinations of 2T and 3T instructions, one can create arbitrary delays to the nearest T. For example, suppose the cap timing loop is run three times. The first time, an initial delay of 2T is added; the second time, 3T; and the third time 4T. Let n be the effective loop count. If the timing resolution is 3T, then we have total loop times of:

$$2T+3nT \quad (1)$$

$$3T+3nT \quad (2)$$

$$4T+3nT \quad (3)$$

Suppose we then try to measure cap delays of 9T, 10T and 11T. Using a single, straightforward 3T-resolution loop, these delays would all yield a loop count of 3 (i.e., 3nT+0, 3nT+1and 3nT+2), demonstrating the limitations of un-enhanced resolution. With the added delays, however, we obtain different results. For the cap delay of 9T, the three loops yield these values of n: 3, 2, and 2 (7 in total). For 10T, we get 3, 3, 2 (8 in total). For 11T: 3, 3, 3 (9 in total). Thus, we have measured the cap delay to the nearest T, according to the formula:

Actual Delay=(((total loop count $X$ 3)+(2+3+4))/3)−1

This assumes that the cap delay does not change between measurements. For practical purposes, this issue is insignificant, since the averaging effect of three measurements is generally desirable.

Non-Contact Object Sensing

Figure 4:
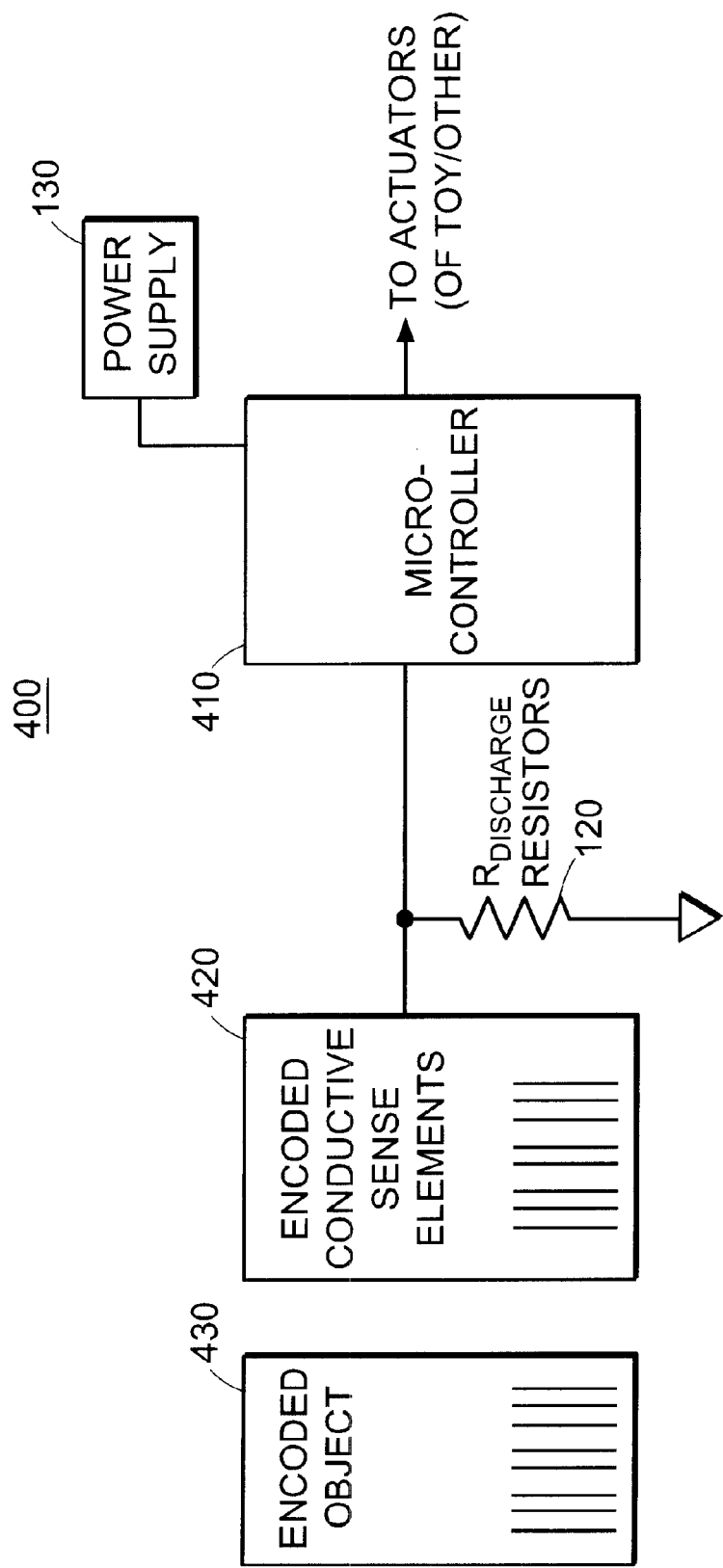
FIG. 4 is a schematic diagram illustrating an embodiment of the invention that provides non-contact object identification.

FIG. 4 depicts another embodiment of the invention, suitable for providing object identification without the need for electrical contact. The illustrated system 400, which might be embedded, for example, in a toy, is similar to that shown in FIG. 1, including a microcontroller 410, but with multiple conductive sense elements 420 arranged in a grid or other pattern, i.e., "encoded". This pattern of capacitive sense areas lines up with a similar pattern in an object to be sensed, i.e., the "encoded" object 430. In each case (i.e., in the toy as well as in the object to be sensed) the sense areas can be internal, with no exposed contact areas necessary. Each toy and object to be sensed has its own binary code, which is realized by a different pattern of internal connections among its sense areas.

Example—My Real Baby™

Aspects of the present invention are utilized in the My Real Baby™ baby doll product available from Hasbro, Inc., using technology from iRobot Corporation, Somerville, Mass. This doll, unlike others, does not use conventional (and unnatural-appearing) pushbuttons or squeeze switches. Instead, a child can simply hold the doll, touch its sides or feet, or pat it on the back, to elicit various play responses from the doll. This is achieved using the capacitive sensing technology of the present invention, which is capable of reliably detecting touch through several layers of fabric and polyester stuffing, as well as through various plastics. No metal components are exposed to the outside; and the doll looks and interacts in an entirely natural way. Thus, the My Real Baby product derives its uniquely realistic and responsive behaviors from the integrated system of components described herein. Digital signal processing transforms noisy signals, from a set of extremely inexpensive sensors, into robust virtual sensor that allows a child to direct the play pattern (e.g., sensing and responding to petting of a doll) using natural child/doll interaction.

Technical Advantages

The present invention is an integrated sensing and digital signal processing system consisting of a simple sense element, an inexpensive microcontroller typically already present in the object, digital signal processing, software-based virtual sensors (such as touch, tickle, and the like). The invention eliminates many requirements of the prior art, such as variable frequency oscillators, frequency dividers, specific sense geometries or materials; and provides a low-cost solution to sensing applications. In addition, it allows multiple sensors per microcontroller; automatic calibration and compensation for drift over time; noise rejection that reduces false positives; recognition of signal patterns or "signatures"; and synthesis of high-level virtual sensors.

In addition, the invention uses existing I/O and clock resources, can use any conductive material for the sense element, and simplifies sense element design (including the use of conductive plastic, carbon-based coatings, or flexible elements built into the structure of the toy or other object).

The signal processing aspects enable the highest possible resolution for a given microprocessor clock frequency; high sensitivity to small signals superimposed on background capacitance offsets; good immunity to electrical noise spikes and other sources of interference; and automatic calibration to compensate for initial component differences and drift. The leaky integrator aspect of the system requires no factory calibration (a single factory calibration with consistency-based update may be suitable for some applications, and long-term averager may be suitable for others). In addition, the system can supply a relative signal value as well as a binary-thresholded value. It also permits auto-thresholding (in addition to calibration) in some applications.

It will be appreciated that the signal processing described above can produces a value representative of the similarity of the sensor signal input to a particular signature. In a toy, the value would indicate similarity of the input to the signature of a particular play pattern (i.e., a signature of proximity, pressure or motion over time). The system can discriminate, for example, between or among the different signatures of tickle, touch, burp, slap hold and others, even using the relatively slow and inexpensive 8-bit microcontrollers available in toys.

The virtual sensors described herein enable a toy or other object to "know" not only that it is being manipulated, but how it is being manipulated. Because the sensors are inexpensive and can be placed anywhere in or on the object, the synthesis of information from multiple sensors can be powerful, enabling a doll, for example, to distinguish between hugging, soothing and tickling. Virtual sensors can integrate information from multiple physical sensors and from other virtual sensors. For example, the simplified definition of a hug might be (1) upright orientation; (2) touch sensors activated on tummy and back; (3) no bottle present; and (4) no burping activity. (See, e.g., FIG. 3.). The signal processing methods described herein enable a system that (1) is sensitive to very small changes in capacitance despite large sensor offsets; (2) rejects random sensor noise caused by, for example, nearby electrical circuitry; (3) selfcalibrates at the factory to compensate for variations in chip specifications and other manufacturing tolerances; and (4) auto-calibrates for drift over time.

It will be understood that the invention can be used to replace mechanical switches on toys to facilitate natural interactions, or pressure-sensitive keys on musical instruments. It can also enable rotary position sensing using a movable dielectric (such as in servo feedback or orientation sensor applications); and relative position sensing (as in robot bump sensor, or accelerometer applications). The invention is also adaptable for use in smart furniture and whole-body game applications.

Those skilled in the art will appreciate that the foregoing is presented by way of illustration only, and not as a limitation; and that changes and modifications may be made without departing from the invention, the scope of which is defined solely by the following claims.

I claim:

1. A capacitive sensing system comprising:
   a microcontroller, operable to receive electrical power from an electrical power source, and having at least one digital logic input/output (I/O) port;
   a conductive sense element in electrical communication with the port; and
   a resistance element in electrical communication with the sense element to form an electrical pathway from the sense element to an electrical discharge point;
   wherein the microcontroller is further operable to:
      at a first time, charge the sense element by causing a selected voltage to be place on the port;
      at a second time, cease placing the selected voltage on the port;
      thereafter, measure voltage at the port, the voltage at the port being representative of voltage at the sense element; and
      measure a parametric value required for voltage at the sense element to decline to a value below a threshold value, the parametric value being representative of an effective capacitance formed by at least the sense element and a first object that may be in contact or proximity with the sense element, whereby the parametric value is representative of contact or proximity between the sense element and the first object; and
   wherein the microcontroller is further operable to perform digital signal processing on signals derived from the sense element, such signal processing including pattern recognition comprising the synthesis of at least one virtual sensor capable of detecting selected patterns of contact or proximity between the first object and the sense element; and wherein the selected patterns of contact or proximity include any of activity, hold, squeeze, tickle, pet, slap, rhythm or bounce patterns; and
   wherein the capacitive sensing system is adapted for embedding in a second object.

2. A capacitive sensing system comprising:
   a microcontroller, operable to receive electrical power from an electrical power source, and having at least one digital logic input/output (I/O) port;
   a conductive sense element in electrical communication with the port; and
   a resistance element in electrical communication with the sense element to form an electrical pathway from the sense element to an electrical discharge point;
   wherein the microcontroller is further operable to:
      at a first time, charge the sense element by causing a selected voltage to be placed on the port;
      at a second time, cease placing the selected voltage on the port;
      thereafter, measure voltage at the port, the voltage at the port being representative of voltage at the sense element; and
      measure a parametric value required for voltage at the sense element to decline to a value below a threshold value, the parametric value being representative of an effective capacitance formed by at least the sense element and a first object that may be in contract or proximity with the sense element, whereby the parametric value is representative of contact or proximity between the sense element and the first object;
   wherein the microcontroller is further operable to perform digital signal processing on signals derive from the sense element, the signal processing including automatic calibration; and
   wherein the microcontroller is further operable to
      detect, at power-up, a first stable value at the sense element;
      designate that first detected stable value as an initial calibration value;
      increment, at a fixed interval, the initial calibration value;
      thereafter, continuously examine detected values; and
      when a new stable value lower than a current calibration value is detected, replace the current calibration value with the new stable value.

3. The A method of capacitive sensing, the method comprising:
   providing a microcontroller, operable to receive electrical power from an electrical power source, and having at least one digital logic input/output (I/O) port;
   providing a conductive sense element in electrical communication with the port, and
   providing a resistance element in electrical communication with the sense element to form an electrical pathway from the sense element to an electrical discharge point; and
   configuring the microcontroller to:
      at a first time, charge the sense element by causing a selected voltage to be placed on the port;
      at a second time, cease placing the selected voltage on the port;
      thereafter measure voltage at the port, the voltage at the port being representative of voltage at the sense element; and
      measure a parametric value required for voltage at the sense element to decline to a value below a threshold value, the parametric value being representative of an effective capacitance formed by at least the sense element and a first object that may be in contact or proximity with the sense element, whereby the parametric value is representative of contact or proximity between the sense element and the first object; and
   configuring the microcontroller to perform digital signal processing on signals derived from the sense element, such signal processing including pattern recognition comprising
      synthesizing at least one virtual sensor capable of detecting selected patterns of contact or proximity between the first object and the sense element wherein the selected patterns of contact or proximity include any of activity, hold, squeeze, tickle, pet, slap, rhythm or bounce patterns; and adapting the capacitive sensing method for embedding in a second object.

4. A method of capacitive sensing, the method comprising:

providing a microcontroller, operable to receive electrical power from an electrical power source, and having at least one digital logic input/output (I/O) port;

providing a conductive sense element in electrical communication with the port, and providing a resistance element in electrical communication with the sense element to form an electrical pathway from the sense element to an electrical discharge point; and configuring the microcontroller to:
at a first time, charge the sense element by causing a selected voltage to be placed on the port;
at a second time, cease placing the selected voltage on the port;
thereafter, measure voltage at the port, the voltage at the port being representative of a voltage at the sense element; and
measure a parametric value required for voltage at the sense element to decline to a value below a threshold value, the parametric value being representative of an effective capacitance formed by the at least one sense element and a first object that may be in contact or proximity with the sense element, whereby the parametric value is representative of contact or proximity between the sense element and the first object; and configuring the microcontroller to perform digital signal processing on signals derived from the sense element, the signal processing including continuous calibration; and configuring the microcontroller to
detect, at power-up, a first stable value at the sense element;
designate that first detected stable value as an initial calibration value;
increment, at a fixed interval, the initial calibration value;
thereafter, continuously examine detected values; and
when a new stable value lower than a current calibration value is detected, replace the current calibration value with the new stable value.

5. A capacitive sensing system comprising:

a microcontroller, operable to receive electrical power from an electrical power source, and having at least one digital logic input/output (I/O) port;

a conductive sense element in electrical communication with the port; and a resistance element in electrical communication with the sense element to form an electrical pathway from the sense element to an electrical discharge point;

wherein the microcontroller is further operable to:
at a first time, charge the sense element by causing a selected voltage to be place on the port;
at a second time, cease placing the selected voltage on the port;
thereafter, measure voltage at the port, the voltage at the port being representative of voltage at the sense element; and
measure a parametric value required for voltage at the sense element to decline to a value below a threshold value, the parametric value being representative of an effective capacitance formed by at least the sense element and a first object that may be in contact or proximity with the sense element, whereby the parametric value is representative of contact or proximity between the sense element and the first object; and wherein the microcontroller is further operable to perform digital signal processing on signals derived from the sense element, such signal processing including pattern recognition comprising the synthesis of multiple virtual sensors from a single sense element, each virtual sensor being capable of detecting selected patterns of contact or proximity between the first object and the sense element; and wherein the selected patterns of contact or proximity include any of activity, hold, squeeze, tickle, pet, slap, rhythm or bounce patterns; and wherein the capacitive sensing system is adapted for embedding in a second object.

6. A capacitive sensing system comprising:

a microcontroller, operable to receive electrical power from an electrical power source, and having at least one digital logic input/output (I/O) port;

a conductive sense element in electrical communication with the port; and a resistance element in electrical communication with the sense element to form an electrical pathway from the sense element to an electrical discharge point;

wherein the microcontroller is further operable to:
at a first time, charge the sense element by causing a selected voltage to be placed on the port;
at a second time, cease placing the selected voltage on the port;
thereafter, measure voltage at the port, the voltage at the port being representative of voltage at the sense element; and
measure a parametric value required for voltage at the sense element to decline to a value below a threshold value, the parametric value being representative of an effective capacitance formed by at least the sense element and a first object that may be in contract or proximity with the sense element, whereby the parametric value is representative of contact or proximity between the sense element and the first object;

wherein the microcontroller is further operable to perform digital signal processing on signals derive from the sense element, the signal processing including continuous calibration; and wherein the microcontroller is further operable to
detect, at power-up, a first stable value at the sense element;
designate that first detected stable value as an initial calibration value;
increment, at a fixed interval, the initial calibration value;
thereafter, continuously examine detected values; and
when a new stable value lower than a current calibration value is detected, replace the current calibration value with the new stable value.

7. A method of capacitive sensing, the method comprising:

providing a microcontroller, operable to receive electrical power from an electrical power source, and having at least one digital logic input/output (I/O) port;

providing a conductive sense element in electrical communication with the port, and providing a resistance element in electrical communication with the sense element to form an electrical pathway from the sense element to an electrical discharge point; and configuring the microcontroller to:
- at a first time, charge the sense element by causing a selected voltage to be placed on the port;
- at a second time, cease placing the selected voltage on the port;
- thereafter measure voltage at the port, the voltage at the port being representative of voltage at the sense element; and
- measure a parametric value required for voltage at the sense element to decline to a value below a threshold value, the parametric value being representative of an effective capacitance formed by at least the sense element and a first object that may be in contact or proximity with the sense element, whereby the parametric value is representative of contact or proximity between the sense element and the first object; and configuring the microcontroller to perform digital signal processing on signals derived from the sense element, such signal processing including pattern recognition comprising
- synthesizing multiple virtual sensors from a single sense element, each virtual sensor being capable of detecting selected patterns of contact or proximity between the first object and the sense element wherein the selected patterns of contact or proximity include any of activity, hold, squeeze, tickle, pet, slap, rhythm or bounce patterns, and adapting the capacitive sensing system for embedding in a second object.

8. A method of capacitive sensing, the method comprising:

providing a microcontroller, operable to receive electrical power from an electrical power source, and having at least one digital logic input/output (I/O) port;

providing a conductive sense element in electrical communication with the port, and providing a resistance element in electrical communication with the sense element to form an electrical pathway from the sense element to an electrical discharge point; and configuring the microcontroller to
- at a first time, charge the sense element by causing a selected voltage to be placed on the port;
- at a second time, cease placing the selected voltage on the port;
- thereafter, measure voltage at the port, the voltage at the port being representative of a voltage at the sense element; and
- measure a parametric value required for voltage at the sense element to decline to a value below a threshold value, the parametric value being representative of an effective capacitance formed by the at least one sense element and a first object that may be in contact or proximity with the sense element, whereby the parametric value is representative of contact or proximity between the sense element and the first object; and configuring the microcontroller to perform digital signal processing on signals derived from the sense element, the signal processing including continuous calibration; and configuring the microcontroller to
- detect, at power-up, a first stable value at the sense element;
- designate that first detected stable value as an initial calibration value;
- increment, at a fixed interval, the initial calibration value;
- thereafter, continuously examine detected values; and
- when a new stable value lower than a current calibration value is detected, replace the current calibration value with the new stable value.

* * * * *